United States Patent
Lesso et al.

(10) Patent No.: US 12,399,226 B2
(45) Date of Patent: Aug. 26, 2025

(54) ELECTROCHEMICAL CELL CHARACTERISATION

(71) Applicant: Cirrus Logic International Semiconductor Ltd., Edinburgh (GB)

(72) Inventors: John P. Lesso, Edinburgh (GB); Yanto Suryono, Tokyo (JP); Toru Ido, Tokyo (JP)

(73) Assignee: Cirrus Logic Inc., Austin, TX (US)

( * ) Notice: Subject to any disclaimer, the term of this patent is extended or adjusted under 35 U.S.C. 154(b) by 250 days.

(21) Appl. No.: 18/327,454

(22) Filed: Jun. 1, 2023

(65) Prior Publication Data

US 2023/0408596 A1    Dec. 21, 2023

Related U.S. Application Data

(60) Provisional application No. 63/353,915, filed on Jun. 21, 2022.

(51) Int. Cl.
*G01N 27/327* (2006.01)
*G01R 31/389* (2019.01)
*H01M 10/42* (2006.01)

(52) U.S. Cl.
CPC ...... *G01R 31/389* (2019.01); *H01M 10/4285* (2013.01)

(58) Field of Classification Search
CPC .................................................. G01R 31/389
See application file for complete search history.

(56) References Cited

U.S. PATENT DOCUMENTS

| 6,172,483 B1* | 1/2001 | Champlin ............ G01R 31/389 320/134 |
| 2018/0043778 A1 | 2/2018 | Murbach et al. |
| 2022/0182014 A1* | 6/2022 | Olayiwola .............. H02S 50/10 |

FOREIGN PATENT DOCUMENTS

JP    2008204125 A    9/2008

OTHER PUBLICATIONS

Combined Search and Examination Report under Sections 17 and 18(3), UKIPO, Application No. GB2308245.6, mailed Nov. 16, 2023.

* cited by examiner

*Primary Examiner* — Alesa Allgood
(74) *Attorney, Agent, or Firm* — Jackson Walker L.L.P.

(57) ABSTRACT

Circuitry for determining an impedance of an electrochemical cell comprising at least one first electrode and a second electrode, the circuitry comprising: drive circuitry configured to apply a stimulus to the electrochemical cell; sense circuitry configured to measure a response of the electrochemical cell to the stimulus; and processing circuitry configured to: determine an estimated transfer function of the electrochemical cell based on the stimulus and the response; determine a score for the estimated transfer function; and adjust the stimulus or circuitry used to measure the response based on the score.

25 Claims, 5 Drawing Sheets

ELECTROCHEMICAL CELL CHARACTERISATION

TECHNICAL FIELD

The present disclosure relates to circuitry for measuring characteristics in electrochemical sensors.

BACKGROUND

Electrochemical impedance spectroscopy (EIS) (also known as dielectric spectroscopy) is a known technique for characterising electrochemical systems, such as electrochemical cells. This technique measures the impedance of a system over a range of frequencies, and therefore a frequency response of the system. Properties of the system, including energy storage and dissipation properties, can be ascertained from this measured frequency response.

A traditional approach to EIS involves using a digital-to-analog converter (DAC) to drive a stimulus, typically a sine wave, into an electrochemical system and using an analog-to-digital converter (ADC) to measure a response to that stimulus. For an amperometric electrochemical sensor (e.g. a potentiostat), the stimulus is typically a voltage, and the measured response is a current. For a potentiometric electrochemical sensor (e.g. a pH sensor or other ion selective electrode (ISE) sensor), EIS can be performed by applying a current and measuring a voltage. For an electrochemical cell acting as a power source (i.e. a battery), the driving stimulus is typically a current, and the measured response is a voltage. The frequency of the stimulus can be varied (e.g., swept) to obtain a response over a range of stimulation frequencies.

Characteristics of electrochemical cells are often ascertained from measured responses to high frequency stimulation (e.g., in excess of 1 MHz). However, driving a stimulus at such high frequencies comes with a cost of higher power and greater complexity associated with the DAC and ADC as well as associated amplifiers, feedback and/or feedback loops which may be incorporated into drive and measurement circuitry.

When such circuitry is battery powered, for example when an electrochemical sensor is integrated into a wearable device, it is desirable for the sensor to be as small as possible and use as little power as possible.

SUMMARY

According to a first aspect of the disclosure, there is provided circuitry for determining an impedance of an electrochemical cell comprising at least one first electrode and a second electrode, the circuitry comprising: drive circuitry configured to apply a stimulus to the electrochemical cell; sense circuitry configured to measure a response of the electrochemical cell to the stimulus; and processing circuitry configured to: determine an estimated transfer function of the electrochemical cell based on the stimulus and the response; determine a score for the estimated transfer function; and adjust the stimulus or circuitry used to measure the response based on the score.

The processing circuitry may be configured to: determine the impedance of the electrochemical cell based on the estimated transfer function.

The impedance of the electrochemical cell may be determined based on the estimated transfer function if the score is above a first confidence threshold.

The circuitry may be configured to: apply the adjusted stimulus to the electrochemical cell; measure an adjusted response to the electrochemical cell to the stimulus; and determine an adjusted estimated transfer function of the electrochemical cell based on the adjusted stimulus and the adjusted response.

The processing circuitry may be configured to: determine the impedance of the electrochemical cell based on the adjusted estimated transfer function.

The processing circuitry may be configured to: combine the estimated transfer function and the adjusted estimated transfer function to obtain a combined estimated transfer function; and determine the impedance of the electrochemical cell based on the combined estimated transfer function.

Adjusting the stimulus may comprise adjusting an amplitude of the stimulus. Adjusting the stimulus may comprise adjusting a period of the stimulus signal.

The stimulus may comprise a step signal or an impulse signal.

The stimulus may comprise a pseudorandom sequence. The processing circuitry may comprise a plurality of linear feedback shift registers (LFSRs) configured to generate the stimulus, wherein adjusting the stimulus comprises switching generation of the stimulus from a first LFSR of the plurality of LFSRs to a second LFSR of the plurality of LFSRs. The first and second LFSRs may have different periods.

Adjusting the stimulus may comprise varying the number of samples output by the one of the LFSRs before switching generation of the stimulus to the other of the plurality of LFSRs.

Adjusting the sense circuitry used to measure the response may comprise adjusting a resistance of the sense circuitry.

Adjusting the resistance of the sense circuitry may comprise adjusting a series resistance provided in series with the second electrode of the electrochemical cell.

Adjusting the sense circuitry used to measure the response may comprise adjusting a bandwidth of an amplifier of the sense circuitry.

The bandwidth of the amplifier may be adjusted in dependence on the bandwidth of the applied stimulus.

Determining the score may comprise determining a coherence between the stimulus and the response.

Determining the score may comprise determining a consistency between the stimulus and the response. Determining the consistency may comprise determining Kramers-Kronig relations of the estimated transfer function.

Determining the score may comprise: determining a coherence between the stimulus and the response; determining a consistency between the stimulus and the response; and combining the coherence and the consistency to obtain the score. The coherence and the consistency may be combined in a weighted combination to obtain the score.

The score may be generated for a plurality of different frequency bands of the response.

Determining the score may comprise determining one or more quality metrics.

For example, one or more quality metrics may be determined comprising one or more: a central tendency of the estimated transfer function; a central tendency of the response; a statistical spread of the estimated transfer function; and a statistical spread of the response. The one or more quality metrics may be determined for a plurality of different frequency bands of the response.

In some embodiments, the stimulus may comprise a voltage stimulus and the measured response may comprise a response current. In such case, the electrochemical cell may comprise an amperometric sensor, such as a potentiostat.

In some embodiments, the stimulus may comprise a stimulus current and the measured response may comprise a voltage response. In such cases, the electrochemical cell may comprise a potentiometric sensor (such as an ion selective electrolyte sensor (e.g. a pH meter). Alternatively, the electrochemical cell may comprise or be part of a power source (e.g. a battery).

According to another aspect of the disclosure, there is provided a system comprising the circuitry described above; and the electrochemical cell described above.

According to another aspect of the disclosure, there is provided an electronic device, comprising the circuitry or the system described above.

The electronic device may comprise an analyte monitor, such as a continuous glucose monitor.

The electronic device may comprise an ion selective electrolyte sensor (such as a pH meter).

The electronic device may comprise a power source, such as a battery.

The electronic device may comprise or be incorporated into one of a mobile computing device, a laptop computer, a tablet computer, a games console, a remote control device, a home automation controller or a domestic appliance, a toy, a robot, an audio player, a video player, or a mobile telephone, and a smartphone.

According to another aspect of the disclosure, there is provided a method of determining an impedance of an electrochemical cell comprising at least one first electrode and a second electrode, the method comprising: applying a stimulus to the electrochemical cell, the stimulus having a stimulation frequency and a stimulation amplitude; measuring a response of the electrochemical cell to the stimulus; and determining an estimated transfer function of the electrochemical cell based on the stimulus and the response; determining a score for the estimated transfer function; and adjusting the stimulus or circuitry used to measure the response based on the score.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

BRIEF DESCRIPTION OF DRAWINGS

Embodiments of the present disclosure will now be described by way of non-limiting examples with reference to the drawings, in which.

DESCRIPTION OF EMBODIMENTS

Electrochemical sensors are widely used for the detection of one or more particular chemical species, analytes, as an oxidation or reduction current. Such sensors comprise an electrochemical cell, consisting of two or more electrodes configured for contact with an analyte whose concentration is to be ascertained. Such sensors also comprise circuitry for driving one or more of the electrodes and for measuring a response at one or more of the electrodes. Batteries also comprise one or more electrochemical cells which typically consist of two or more electrodes (e.g., an anode and a cathode) configured for contact with a conductive electrolyte. Characteristics of batteries may be ascertained using drive and measurement circuitry similar to that used for characterising electrochemical cells in electrochemical sensors.

Embodiments of the present disclosure provide various novel drive and measurement regimes for characterising electrochemical cells and systems (such as sensors, batteries and the like) into which electrochemical cells are incorporated.

Figure 1:
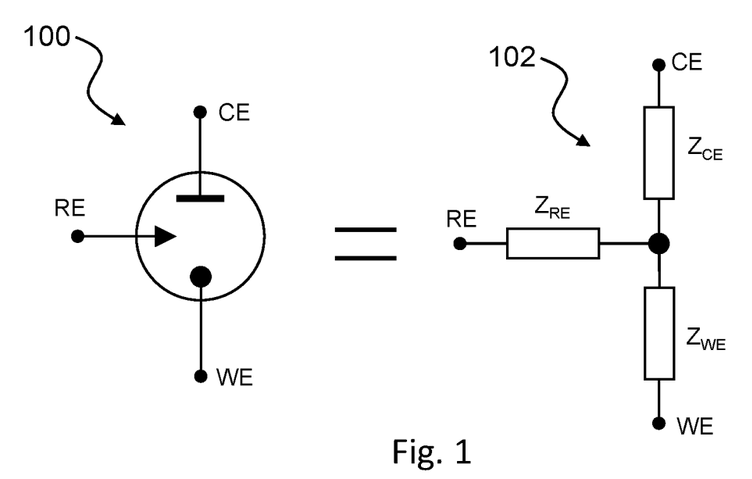
FIG. 1 illustrates a schematic diagram and electrical equivalent circuit for a three-electrode electrochemical cell.

FIG. 1 is a schematic diagram of an example electrochemical cell 100 comprising three electrodes, namely a counter electrode CE, a working electrode WE and a reference electrode RE. FIG. 1 also shows an equivalent circuit 102 for the electrochemical cell comprising a counter electrode impedance ZCE, a working electrode impedance ZWE and a reference electrode impedance ZRE. Embodiments of the disclosure will be described with reference to this example electrochemical cell 100. It will be appreciated, however, that the techniques and apparatus described herein may be used in conjunction with any conceivable electrochemical system, including but not limited to two-electrode electrochemical cells (e.g., cells comprising a counter electrode CE and a working electrode WE and no reference electrode), or electrochemical cells with more than three electrodes. Electrodes of the electrochemical cells described herein may also be referred to as anodes and/or cathodes as is conventional in the field of electrical batteries.

To determine a characteristic of the electrochemical cell 100, and therefore an analyte concentration, a bias voltage is applied at the counter electrode CE and a current at the working electrode WE is measured. The reference electrode RE is used to measure a voltage drop between the working electrode WE and the reference electrode RE. The bias voltage is then adjusted to maintain the voltage drop between RE and WE constant. As the resistance in the cell 100 increases, the current measured at the working electrode WE decreases. Likewise, as the resistance in the cell 100 decreases, the current measured at the working electrode WE increases. Thus the electrochemical cell 100 reaches a state of equilibrium where the voltage drop between the reference electrode RE and the working electrode WE is maintained constant. Since the bias voltage at the counter electrode CE and the measured current at WE are known, the resistance of the cell 100 can be ascertained.

Figure 2:
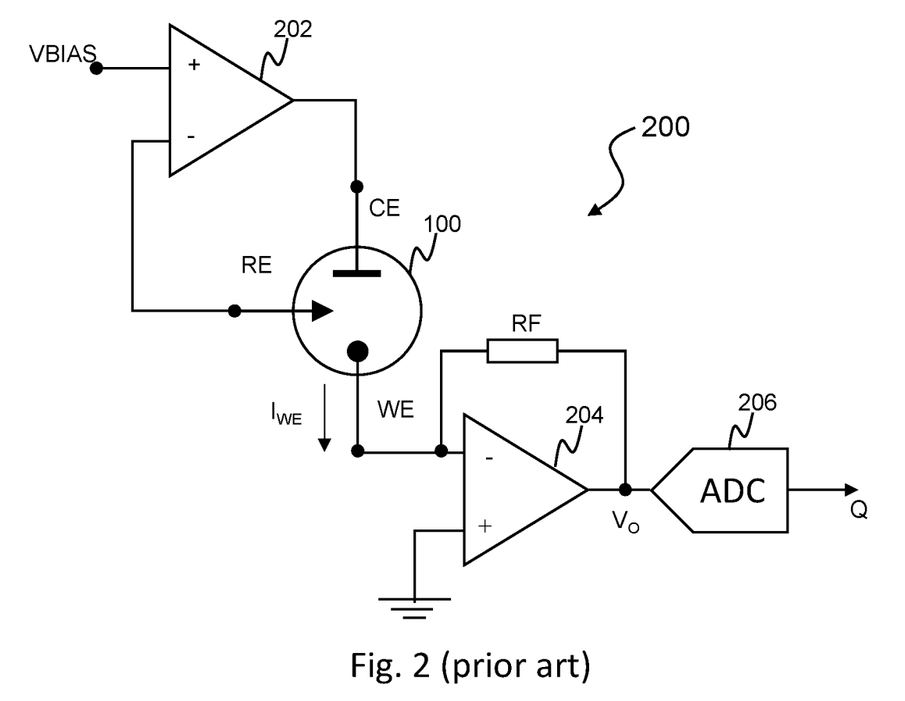
FIG. 2 is a schematic diagram of an example prior art measurement circuit.

FIG. 2 illustrates an example prior art drive and measurement circuit 200 which is configured to implement the above explained cell characterisation, specifically for measuring an analyte concentration in the electrochemical cell 100 shown in FIG. 1. The circuit 200 comprises a first amplifier 202 and a second amplifier 204. Each of the first and second amplifiers 202, 204 may comprise one or more op-amps. A non-inverting input of the first amplifier 202 is coupled to a bias voltage VBIAS which may be generated by a digital-to-analog converter DAC (not shown). An inverting input of the first amplifier 202 is coupled to the reference electrode RE. An output of the first amplifier 202 is coupled to the counter electrode CE and configured to drive the counter electrode CE with a counter electrode bias voltage VCE. The counter electrode bias voltage VCE applied at the counter electrode CE by the first amplifier 202 is proportional to the difference between the bias voltage VBIAS and the voltage VRE at the reference electrode RE. As such, the first amplifier 202 acts to maintain the voltage between the reference electrode RE and the working electrode WE at the bias voltage VBIAS. An inverting input of the second amplifier 204 is coupled to the working electrode WE and a non-inverting input of the second amplifier 204 is coupled to a fixed reference voltage, in this case ground GND. A feedback resistor RF is coupled between the non-inverting input and an output of the second amplifier 204. As such, the second amplifier 204 may operate as a transimpedance amplifier. The second amplifier 204 is thus operable to output a voltage VO which is proportional to the current IWE at the working electrode WE. The output voltage VO is then provided to an analog-to-digital converter (ADC) 206 which outputs a digital output Q which represents the current IWE at the working electrode WE.

To bias the counter electrode CE, and therefore the electrochemical cell 100, at different voltages, the bias voltage VBIAS may be adjusted. The bias voltage VBIAS may be adjusted between a reference voltage (e.g. ground or zero volts) and the supply voltage VDD. With the non-inverting input of the second amplifier 204 is set at VDD/2, a positive bias may be applied to the cell 100 by maintaining the bias voltage VBIAS above VDD/2. Likewise, a negative bias may be applied to the cell 100 by maintaining the bias voltage VBIAS below VDD/2.

The drive and measurement circuitry 200 described above may be used to implement electro-impedance spectroscopy (EIS) on the cell 100.

To implement conventional EIS, the bias voltage VBIAS may be modulated with a sine wave and the second amplifier 204 and ADC 206 used to measure a response of the cell 100 to that sine wave, in the form of the output voltage VO. The frequency of the sine wave may be adjusted over a range of frequencies in order to obtain a series of frequency dependent impedance measurements of the cell 100. This approach tends to give a high signal-to-noise ratio (SNR) in the measured response. However, if the impedance of the cell 100 is to be measured at multiple frequencies (e.g. so as to obtain the series of frequency dependent impedance measurements) the approach can be time consuming. The time misalignment between sequential measurements at different frequencies can introduce measurement error.

An alternative approach to the above EIS technique is to apply a step or impulse function stimulus to the cell 100 and estimate or infer a transfer function between the stimulus and a response of the cell 100 to that stimulus. This approach is fast when compared to conventional EIS. However, a wide dynamic range is required to accurately capture the response to such stimuli. Additionally, the measured response can be substantially affected by noise and non-linearity in the system which can corrupt measurements, particularly where the applied stimulus has a large amplitude.

Figure 3A:
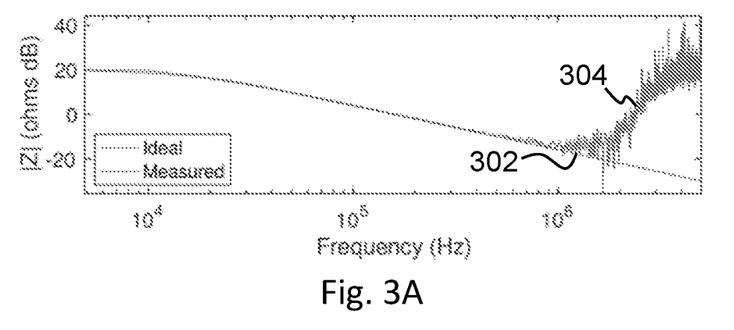
FIG. 3A is a graph showing measured and modelled transfer functions for the electrochemical cell shown in FIG. 1.

FIG. 3A is a graph illustrating a modelled transfer function 302 together with an estimated transfer function 304 of the cell 100. The estimated transfer function 304 is inferred based on the stimulus applied to the cell 100 and the response of the cell 100 to that stimulus. In the example shown in FIG. 3A, the transfer function 304 was inferred in the presence of noise. Due to the presence of this noise, it can be seen that the estimated transfer function 304 does not agree with the modelled transfer function 302 at high frequencies.

Figure 3B:
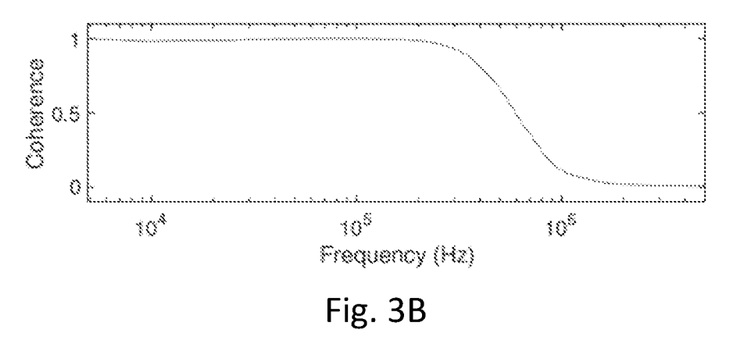
FIG. 3B is a graph showing coherence of the measured and modelled transfer functions shown in FIG. 3A.

FIG. 3B is a graph illustrating coherence of the modelled and estimated transfer functions 302, 304 as a function of frequency. It can be seen that at low frequencies, there is high coherence between the modelled and estimated transfer functions 302, 304. However, at high frequencies, coherence between the estimated transfer function 304 and the modelled transfer function dramatically reduces. This breakdown in coherence at high frequencies is prevalent in systems affected by noise, non-linearity, and other non-ideal effects.

The coherence profile shown in FIG. 3B can be used to identify frequencies at which the estimated transfer function 304 accurately represents the modelled transfer function 302 together with frequencies at which the estimated transfer function 304 diverges from the modelled (ideal) transfer function 302.

Embodiments of the present disclosure aim to implement circuitry for adaptive EIS in which an estimated (inferred) transfer function of an electrochemical cell, derived from a stimulus applied to an electrochemical cell and a response of that cell to the applied stimulus, is analysed to determine a score for that estimated transfer function. The score may represent an accuracy or confidence (e.g., coherence and/or consistency) of inferred transfer function relative to the actual (or ideal) transfer function of the cell. Additionally or alternatively, the score may represent a quality of the estimated transfer function. Based on the determined score, the stimulus and/or the circuitry used to measure the response may be adjusted. The stimulus may then be reapplied using the adjusted stimulus or circuitry conditions to obtain further estimated transfer functions.

By repeating the process of estimating the transfer function of the cell, determining a score and adjusting stimulus and/or circuitry characteristics, multiple estimated transfer functions may be obtained. The estimated transfer functions may then be used to develop an accurate estimate of impedance of the cell over a broad range of frequencies. For example, each estimated transfer function may be accurate for a subset of frequencies. By combining accurate portions of each of the estimated transfer functions, a combined transfer function accurate over an entire frequency range of interest may be obtained. As such, an accurate impedance spectrum for the cell can be obtained.

Various implementation details pertaining to drive and measurement circuitry for obtaining characterising impedance measurements of an electrochemical cell will now be described. Such embodiments focus primarily on electrochemical cells comprised in sensors (e.g. potentiostats). For example, the embodiments described herein may be implemented as part of an analyte monitoring system, such as a continuous glucose monitor (CGM). It will be appreciated, however, that embodiments are not limited to use with electrochemical sensors. For example, batteries also comprise one or more electrochemical cells which typically consist of two or more electrodes (e.g., an anode and a cathode) configured for contact with a conductive electrolyte. Impedance characteristics of batteries (e.g. comprising lithium ion or silver oxide cell(s)) may be ascertained using drive and measurement circuitry described herein, a specific example of which is described with reference to FIG. 8 below. For example, embodiments of the present disclose may be implemented as part of battery monitoring device (e.g. to monitor the status and/or health of a battery).

Figure 4:
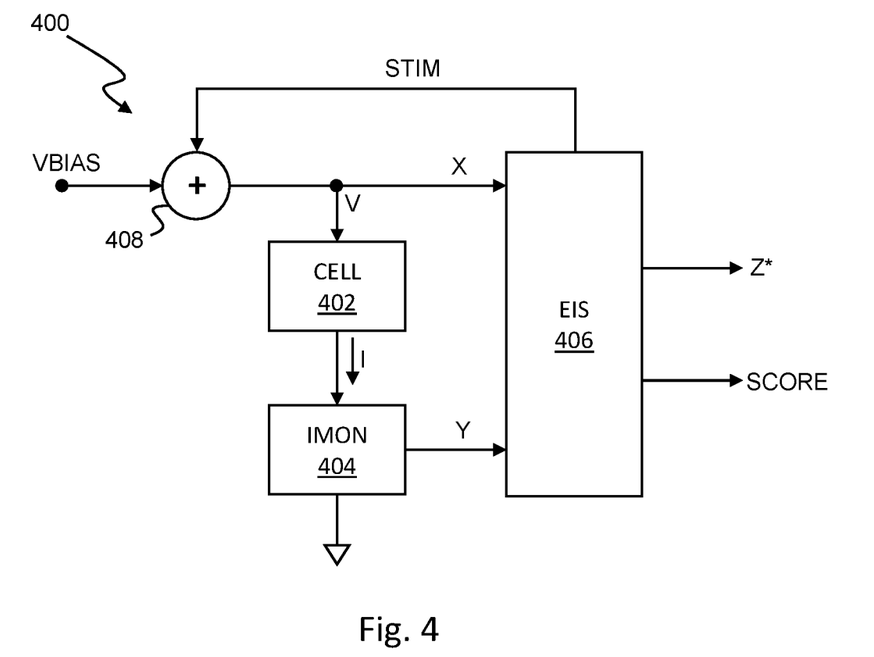
FIG. 4 is a schematic diagram of circuitry for characterising an electrochemical cell.

FIG. 4 is a block diagram of an example implementation of circuitry 400 for implementing adaptive EIS according to embodiments of the present disclosure. The circuitry 400 comprises an electrochemical cell 402, such as the cell 100 shown in FIG. 2, a current monitor 404 and EIS circuitry 406. The EIS circuitry 406 is configured to output a stimulus (such as a step function or sinewave) to an adder 408, which is configured to combine the stimulus STIM with a bias voltage VBIAS and generate a voltage stimulus V. The voltage stimulus V is applied to the cell 402 and also provided to the EIS circuitry 406. The cell 402 is coupled to the current monitor 404 configured to measure a response of the cell 402 to the voltage stimulus V and output a current I to the EIS circuitry 406.

The EIS circuitry 406 is configured to generate a stimulus signal STIM which is combined with a bias voltage VBIAS at the adder 408 to form an input signal X. The current monitor 404 is configured to measure a response of the cell 402 to the input signal X and output a response signal Y. In this example, the input signal X comprises a voltage V and the response signal Y represents a current I through the cell 402. In other embodiments (described below in more detail) the stimulus may be applied as a current, the response of a device under test being a measured voltage.

The input signal X and the response signal Y are provided as inputs to the EIS circuitry 406. The EIS circuitry 406 may be configured to determine a transfer function H for the cell 402 (and associated circuitry) defined as follows.

$$Y = H \cdot X$$

The transfer function H may be derived statistically using, for example, a least squared method or equivalent approximation technique. The transfer function H may represent an impedance Z of the electrochemical cell 402. The impedance Z (or the transfer function H) may be used in several ways, depending on the application of the electrochemical cell 402. For example, where the cell 402 is integrated into an analyte sensor, the impedance Z may be used to infer one or more analyte levels, to assess sensitivity of the sensor, to detect one or more fault conditions associated with the sensor or the cell 402, and/or to detect if the sensor or part thereof has been inserted or implanted (e.g. successfully or unsuccessfully) into a subject (e.g. user). For example, where the cell 402 is integrated into a battery monitor, the impedance Z may be used to assess the condition of the battery or to detecting one or more fault conditions associated with the battery or cell 402. For example, the impedance Z may be used to determine a state of charge/discharge (e.g. available capacity), a state of health (e.g. an output impedance which may be limiting power output), and/or a degree of ageing (e.g. solid electrolyte interphase (SEI) growth) in lithium iron cells. The impedance Z may additionally or alternatively be used to detect the effects of calendar ageing. Additionally or alternatively, the determined impedance Z may be used to initiate compensation and/or adjustment of operation of the circuitry 400.

As has been described above with reference to FIGS. 3A and 3B, the transfer function H may be sensitive to one or more conditions at the circuitry 400. Such may include noise present at the circuitry and/or non-linearities associated with the circuitry 400. As such, the inferred impedance Z may be accurate for some frequencies of interest, but not accurate for other frequencies of interest. Accordingly, the circuitry 400 may be configured to adapt one or more of the stimulus STIM and measurement circuitry used to measure the response Y (e.g., components of the current monitor 404) so as to obtain one or more additional transfer functions HN. Adaptation of the stimulus STIM and/or measurement circuitry 400 may be controlled so that the additional transfer functions HN provide impedance information which more accurately represents the impedance of the cell 402 at frequencies which are not represented accurately by initial the transfer function H.

Figure 5:
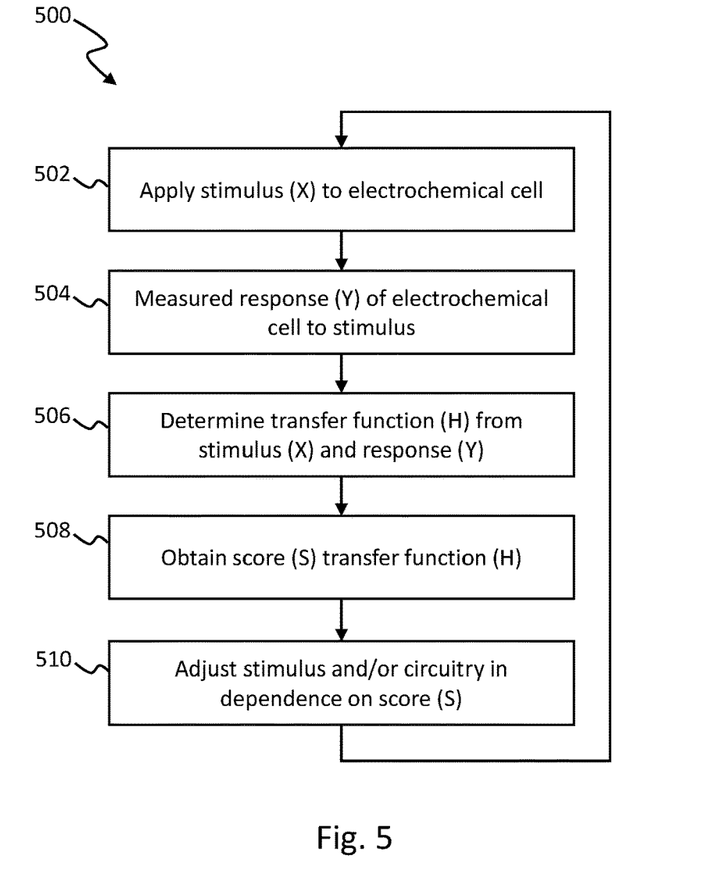
FIG. 5 is a flow diagram for a process performed by the circuitry of FIG. 4.

FIG. 5 illustrates an example process 500 for adaptive EIS which may be implemented by the circuitry 400 shown in FIG. 4.

At step 502, the input signal X may be applied to the electrochemical cell 402. The input signal X is a combination of a stimulus STIM generated by the EIS circuitry 406 and the bias voltage VBIAS (which may also be controlled by the EIS circuitry 406). The stimulus STIM may be a step function or an impulse function. In such cases, the input signal X will also be a step or impulse function.

At step 504, the response Y of the electrochemical cell 402 to the input signal X is measured, for example using the current monitor 404. The response Y is provided to the EIS circuitry 406.

At step 506, the EIS circuitry 406 may determine a transfer function H from the input signal X and the response Y. The transfer function H may be representative of the impedance Z of the cell 402.

At step 508, the transfer function H may be scored to obtain one or more scores S. The one or more scores S may be a single score or multiple scores. Multiple scores may be combined to obtain a single score. The one or more scores S may be obtained based on one or more of the following (each of which are described in further detail below):

Coherence of the transfer function H
Consistency of the transfer function H
One or more quality metrics associated with the transfer function H At step 510, the EIS circuitry 406 may adjust one or more characteristics of the stimulus STIM/input signal X. Additionally or alternatively, the circuitry 406 may adjust one or more characteristics of the circuitry used to measure the response Y. Adjustment of the stimulus STIM, input signal X, and/or circuitry characteristics may be performed in dependence on the one or more obtained scores S for the transfer function. For example, if the score S is below a threshold, adjustment may take place. For example, the score S may be compared to multiple different thresholds and different adjustment actions taken depending on the score S compared to those thresholds. In some embodiments, if the score S exceeds one or more thresholds, no adjustment may take place.

The process 500 may return to step 502 where the (optionally adjusted) input signal X is applied to the electrochemical cell 402. The steps 504, 506, 508 are then repeated to obtain a new (additional) transfer function HN for the cell 402. It will be appreciated that when the process proceeds back to step 502, the input signal X may have changed due to adjustment of the stimulus. Additionally or alternatively, the measured response Y may have changed due to adjustment of the stimulus and/or adjustments of characteristics of the measurement circuitry. As such, the new transfer function HN may provide information pertaining to the cell 402 which is not accurately represented in the initially determined transfer function H.

After or during repetitions of the steps 502:510 of the process 500 the EIS circuitry 406 may have determined multiple transfer functions. The EIS circuitry 406 may be configured to combine two or more of the transfer functions or respective impedances to obtain a combined estimated impedance spectrum Z*. The combined estimated impedance spectrum Z* may comprise combine components of each of the calculated impedances having the highest scores for specific frequencies so as to obtain an overall impedance estimate Z* which represents the impedance of the cell 402 more accurately across a wider range of frequencies. For example, this combination may be performed by performing a piecewise selection of the impedance with the best or most reliable score at given frequencies. Optionally, smoothing may be applied to the combined impedance spectrum Z*. Such smoothing may be based on a modelled impedance for the system. Such smoothing may, for example, be implemented using a statistical filter, such as a Savitzky-Golay filter.

As noted above, the EIS circuitry 406 may determine an estimated transfer function H for the electrochemical cell 402. The estimated transfer function H may be derived in any conceivable manner.

A maximum likelihood estimate of the transfer function H can be found by dividing the power spectrum Sy of the measure response Y by the power spectrum Sx of the input signal X, as defined by the following equation.

$$H = \frac{S_Y}{S_X}$$

It will be appreciated, however, that the above estimate may be inaccurate in the presence of noise (in the input signal X or the measured response Y). To address this inaccuracy, the transfer function can be estimated using least squares regression or similar statistical estimation.

Figure 6:
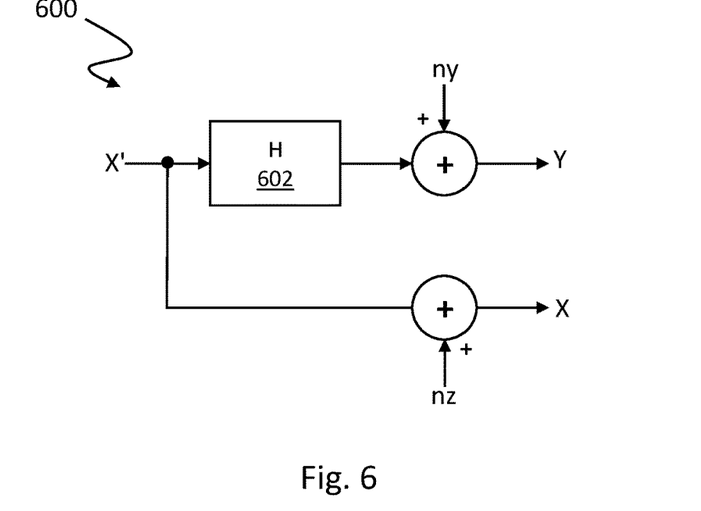
FIG. 6 is a block diagram of a system model of the circuitry of FIG. 4.

FIG. 6 is a system diagram representing the arrangement shown in FIG. 4. In this the input signal X' is the signal applied to the system 602 (which comprises the electrochemical cell 402) and the input signal X as measured by the EIS circuitry may be subject to added noise nx. The measured response Y may also be subject to noise ny. Thus, estimators H1, H2 for the transfer function H can be defined as follows:

$$H_1 = \frac{S_{XY}}{S_{XX}}$$

$$H_2 = \frac{S_{YY}}{S_{YX}}$$

Where X and Y are the respective measured input signal and measured response of the system 602, SXX is the power spectral density of X, SYY is the power spectral density of Y, and SXY and SYX are the cross-spectral densities of X and Y. Thus, transfer function estimators H1 and H2 represent the upper and lower bounds of the true transfer function H of the system 602.

The estimators H1, H2 may be biased in different ways. When nx is zero, the first estimator H1 is unbiased. This corresponds to the situation where the input signal X' is a driven, known signal (i.e., X=X'). When ny is zero, the second estimator H2 is unbiased. When noise is present both in the input signal X' applied to the system 602 and the measured response Y, both estimators H1, H2 are biased. This corresponds to a situation in which the input signal X' and the output signal Y are unknown in advance and measured.

Having regard for the above, it can be shown in that:

$$E[H_1] < H < E[H_2]$$

Hence, the estimators H1, H2 can be used as lower and upper limits on the estimated transfer function H. For example, the estimated transfer function may be defined by the following function:

$$H_\alpha = \frac{S_{YY} - \alpha S_{XX} + \sqrt{\{\alpha S_{XX} - S_{YY}\}^2 + 4\alpha |S_{XY}|^2}}{2 S_{XY}}$$

When α is 1, this transfer function is known as HTLS for total least squares.

As noted above, one or more scores S may be obtained for the estimated transfer function H. A score S may represent a reliability of the estimated transfer function H. As noted above, the score S may be dependent on a coherence, a consistency and/or one or more quality factors associated with the transfer function H.

Coherence may be used to determine a reliability or confidence of an estimated transfer function (or impedance value Z itself). Coherence y between the input signal X and the measured response Y may be defined as follows.

$$\gamma = \frac{|S_{XY}|^2}{S_{XX} S_{YY}}$$

A higher coherence corresponds to a more well-defined transfer function, which in turn suggests a higher confidence that the estimated transfer function accurately represents the actual transfer function. A coherence of 1 represents an exact match of the estimated transfer function to the actual transfer function of the system 602. A coherence of 0 represents no coherence at all.

The coherence of the system 602 shown in FIG. 6 which represents the electrochemical cell 402 and associated circuitry will be less than 1 in the following, non-exhaustive conditions:

There is noise in the measured response Y, leading to a bias.

The relationship between the input signal X and the measured response Y is not linear.

The measured response Y is dependent on a variable other than the input signal X.

For linear systems, the coherence function can be estimated as the portion of the mean square value of the measured response Y that is contributed by the input signal X. This relationship can be used to assess the validity of the derivation of impedance Z of the electrochemical cell 402 based on measurement of the response Y and knowledge or measurement of the input signal X.

Consistency is another measurement that can be used to determine a reliability or confidence of the estimated transfer function H. An approach to determining a transfer function H or a derived impedance Z for consistency is to use Kramers-Kronig (KK) relationships. For the impedance Z(w), being the complex function of the complex variable w, the real component Z'(w) and imaginary component Z"(w) of this complex function Z(w) can be considered as follows.

$$Z(\omega) = Z'(\omega) + iZ''(\omega)$$

KK relationships can be used to calculate the real component Z'(w) from the imaginary component Z"(w) (and vice versa). For valid measurements, the measured component Z(w) and the KK versions should match.

To simplify calculation of the KK relations, a simple form of the relations may be used, assuming certain conditions and caveats are follows. Such conditions may, for example, comprise an assumption that impedance is continuous, smooth and asymptomatically flat. Specifically, under these conditions, the real component Z'(w) can be obtained by calculating the Hilbert transform of the imaginary component Z"(w). Likewise, the imaginary component Z'(w) can be obtained by calculating the Hilbert transform of the real component Z'(w).

$$Z'(\omega)=H(Z''(\omega))$$

$$Z''(\omega)=H(Z'(\omega))$$

Figure 7:
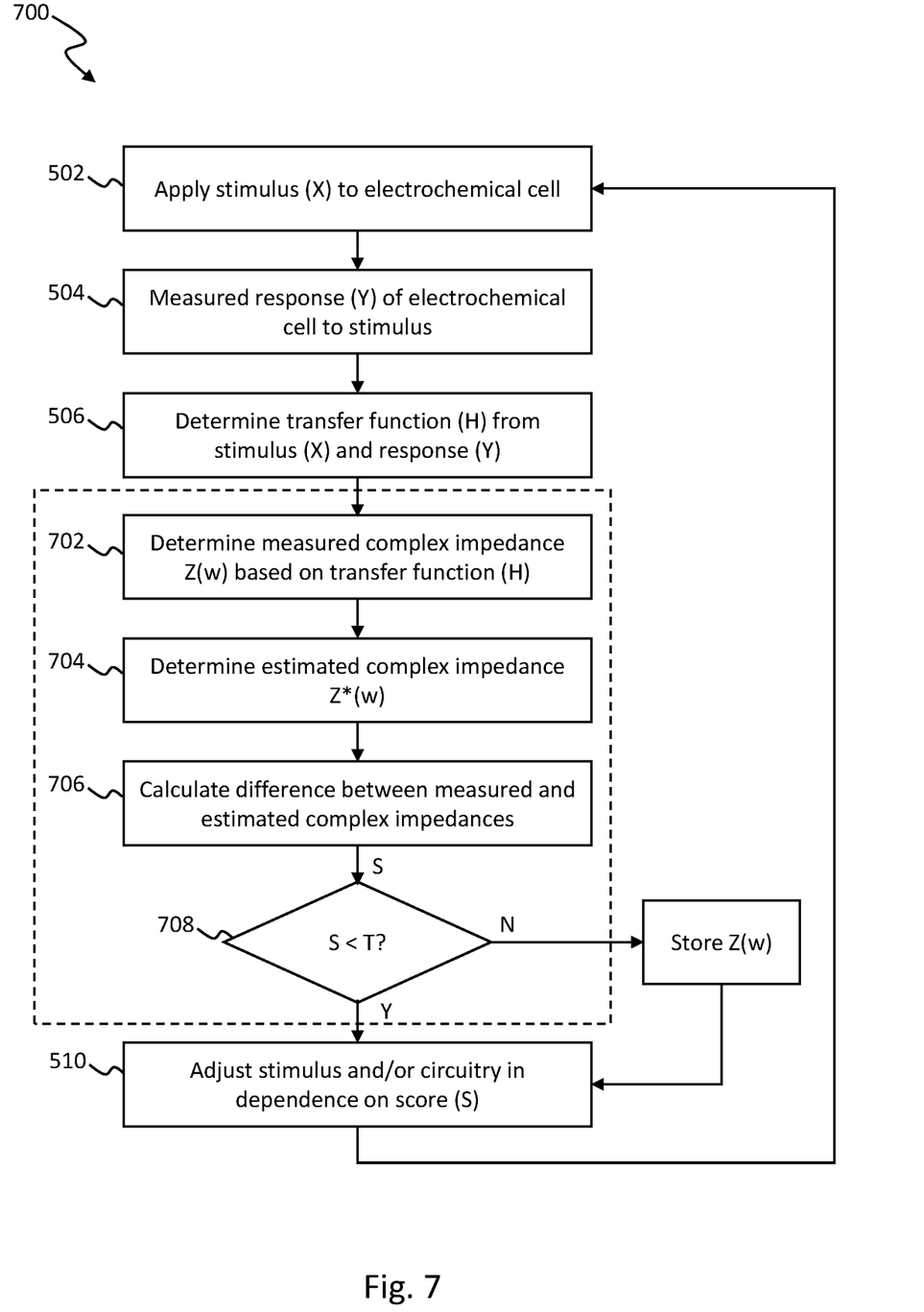
FIG. 7 is a flow diagram for a process performed by the circuitry of FIG. 4.

Based on the above, the process 500 shown in FIG. 5 may be modified as shown in FIG. 7.

FIG. 7 illustrates an example process 700 which may be implemented by the circuitry 400 shown in FIG. 3. Like steps of the processes 500, 700 have been given like numbering.

Steps 502, 504 and 506 of the process 700 are similar to those of the process 500. At step 702, a complex impedance Z(w) is determined based on the transfer function H determined at step 506.

At step 704, a complex impedance Z*(w) is estimated, assuming linearity and causality (i.e., that changes in the measured response Y are delayed relative to the input signal X).

At step 706, the difference between the measured and estimated complex impedances Z(w), Z*(w) is calculated. The difference represents a score S for the measured complex impedance Z(w), i.e. that derived from the determined transfer function H.

At step 708, the score S is compared with a threshold. If the score S is below the threshold T, the measured complex impedance Z(w) is not a useful result and the process 700 proceeds to step 510 where the stimulus STIM or the circuitry used to measure the response Y is adjusted. If the score S is above the threshold, then the measured complex impedance Z(w) is characterised as a useful result and stored at step 710. The process 700 may then proceed to step 510, with an adjustment of the stimulus and/or the circuitry 400 undertaken.

The process 700 may be repeated until errors between measured and estimated impedances Z(w), Z*(w) at a given frequency of interest are minimized to below the threshold T. The measured complex impedances Z(w) may then be combined to obtain an accurate impedance spectrum for the electrochemical cell 402 in which any measurement error is averaged (or smoothed) out.

The error between measured and estimated impedances may be calculated as a relative error, providing a scoring value between 0 and 1. For example, the relative error may be defined as follows.

$$\text{Relative error} = \frac{Z(\omega) - Z*(\omega)}{Z(\omega)}$$

In either of the coherence approach and the KK approach, a score S of greater than 0.5, or preferably greater than 0.75, further preferably greater than 0.95, may be used to indicate that the determined impedance Z for a particular frequency is an accurate reflection of the system 602 (i.e. the electrochemical cell 402). If the score S is less than or equal to 0.5, it may be assumed that the associated determined impedance is unreliable, such that further interrogation of the cell 402 is required (e.g. by adjusting system parameters such as the stimulus STIM, input signal X and/or the circuitry used to measure the response Y).

It will be appreciated that both coherence and consistency may be obtained for a given response Y. Where both are obtained, scores for each (as well as other scores) may be combined to derive a combined score. For example, a weighted combination of coherence and consistency may be derived as the score S. This weighted combination may be defined as follows.

$$S(\omega)=\alpha \cdot Skk(\omega)+(1-\alpha) \cdot Sc(\omega)$$

Where S(w) is the combined score, Skk(w) is the score derived from a Kramer-Kronig based approach, Sc(w) is the score derive from a coherence based approach, and a is the weighting factor.

As noted above, in addition to or as an alternative to coherence or consistency, any conceivable quality metric may be used to obtain a confidence score for a particular measured impedance. For example, a scoring system using confidence intervals from a Welch periodogram may be used. For example, on a frequency bin by frequency basis, Pearson statistics (such as standard deviation, skew, and kurtosis) may be used to quantify how stable or consistence an estimate of impedance in a given frequency bin is. This concept may be extended to cover robust estimate, such as median and median absolute deviation (MAD).

Scores from such quality metric appraisals may be combined with other quality metrics and/or consistency and/or coherence scores to obtain the score S.

In the embodiments described herein, processing of the measured response Y is described as being performed by the EIS circuitry 406. In other embodiments, one or more of such processes may be performed by an external controller, such as an applications process or other digital signal processor provided separately to the circuitry 400 shown in FIG. 4. For example, data obtained or derived from signals applied to or measured from the cell 402 may be sent to an external controller for processing. Such an external processor may be located locally or remotely to the circuitry 400. For example, the external processor may be provided on a host device (such as a cell phone or other computer) or in the cloud.

It will be appreciated that any of the thresholds described herein may be fixed or dynamic. For example, a dynamic threshold may be applied to the score S to determine valid measurements. The dynamic threshold may be adjusted based on the use-case for the circuitry 400. For some use-cases, e.g. for relatively high-performance measurements (where accuracy is important) a relatively high threshold should be used (e.g. 0.9 or greater). Such measurements may include assessing sensor of battery state, determining sensitivity and/or determining analyte concentration. In contrast, for use-cases in which the accuracy of impedance measurements is less critical (such as for sensor insertion detection, crude fault detection etc.) a lower threshold may be used (e.g. 0.6). The dynamic threshold may also be adjusted depending on the frequency at which the impedance is being compared. For example, at some frequencies, accuracy of impedance estimation may be more critical than at other frequencies. The dynamic threshold may therefore be higher for frequencies for which accuracy is more important and vice versa for less critical frequencies.

As noted above, the stimulus STIM and/or the circuitry 400 may be adjusted.

In the case when the stimulus STIM is a pulse (i.e. an impulse) the pulse amplitude and/or pulse width of the stimulus STIM may be adjusted.

As regards the circuitry for measuring the response, in some embodiments a resistance of the circuitry may be adjusted. For example, referring to FIG. 2, a resistance may be provided between the working electrode and the amplifier 204. In which case, this resistance may be adjustable. For example, such a resistance may be variable (e.g. a resistive network). Adjusting of this series resistance may comprise selecting one or more resistors from the resistor network for use in the measurement circuitry.

When the stimulus STIM is a step signal applied to the bias voltage VBIAS, the step may be either unipolar or bipolar. The circuitry 400 may be operable to adjust EIS operation as shown in the table below.

| Symptom | Probable Cause | Fix |
| --- | --- | --- |
| Score is low at all frequencies | SNR is low | Increase amplitude of stimulus (or increase bias voltage) |
|  |  | If amplitude is already above threshold, increase RWE |
| Score is low at low frequencies | Stimulus does not have enough low frequency power | Increase period of stimulus |
| Score is low at high frequencies | Dynamic range issue | Increase RWE |

In the above table, RWE is the resistance at the working electrode WE of the electrochemical cell. This resistance may be adjusted as described above by varying the series resistance provided at a working electrode WE of the cell 402.

As noted above, if the score is low at high frequencies, this may be an indicator of a dynamic range issue. For example, a low score at high frequencies may be caused by those frequencies being outside of the dynamic range of an ADC is used in the current monitor 404 or the EIS circuitry 406 to sample the measured signal Y. For example, where the cell 402 is implemented in an analyte sensor, the sensor may exhibit giga-ohms of impedance at low frequencies and hundreds of ohms at high frequencies. This implies that a measurement current range of between nanoamps and several amps is required. Accordingly, it may be beneficial to (e.g. dynamically) adjust a resistance at the working electrode RWE to ensure that the ADC dynamic range is matched to the impedance being measured.

As noted above, FIG. 4 is described with reference to an electrochemical cell 402 to which a voltage V is applied and a current I is measured. An example of such a cell 402 is a potentiostat, which may be used for sensing applications (such as analyte sensing). Notwithstanding, the various circuitry and electrochemical cells described herein may equally be incorporated into an electrical battery or system for characterising or monitoring a state of a battery, such as a battery monitor or a battery management system (BMS). The term "battery monitor" and "battery management system" are well known in the art and are not to be limited to a special or customized meaning.

Figure 8:
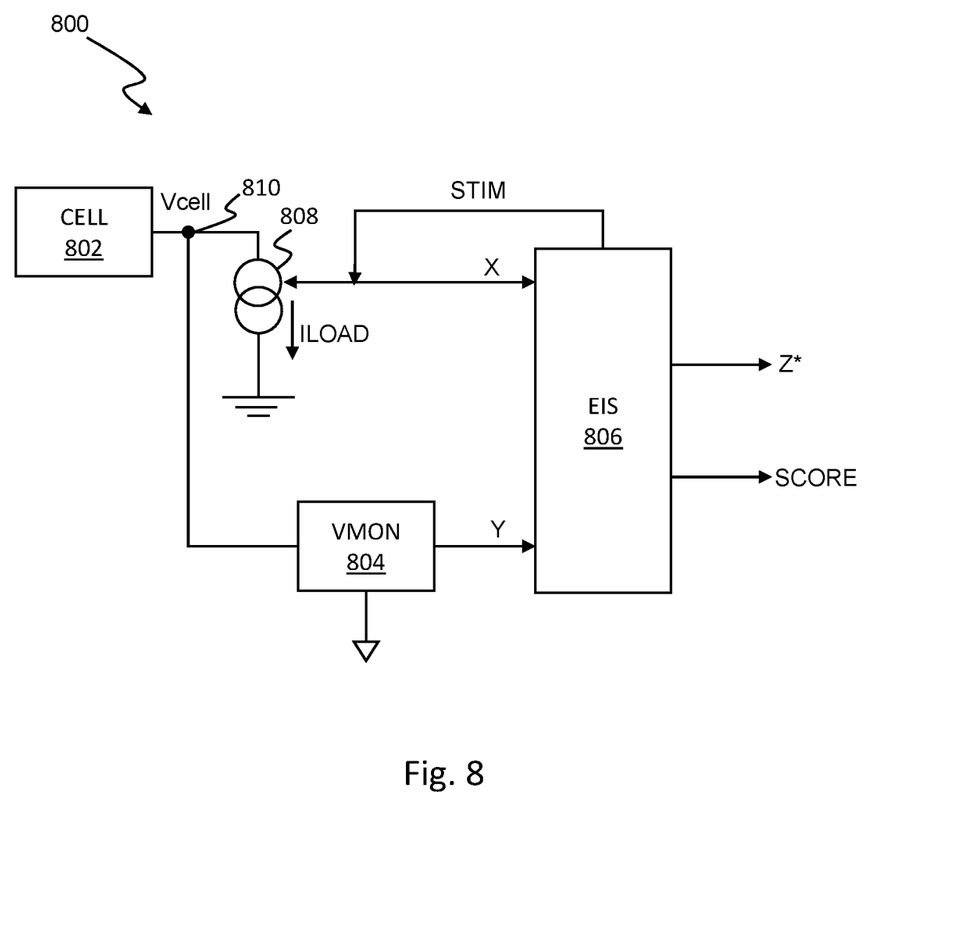
FIG. 8 is a schematic diagram of drive and measurement circuitry for characterising a battery cell.

FIG. 8 is a block diagram of an example implementation of circuitry 800 for implementing adaptive EIS according to embodiments of the present disclosure. The circuitry 800 comprises an electrochemical cell 802, which in this example may comprise a battery cell (e.g., lithium ion or sliver oxide) or a potentiometric sensor (such as an ion selective electrode), a voltage monitor 804, EIS circuitry 806 and a current source 808. The current source 808 is coupled between the cell 802 and a reference voltage (in this case ground GND) at a cell node 810. The cell node 810 is also coupled to the voltage monitor 804 which is configured to output a voltage signal Y (in this case a voltage) to the EIS circuitry 806 representative of the voltage Vcell at the cell node 810. The EIS circuitry 806 is configured to output a current stimulus STIM (such as a step function or sinewave) which is used to modulate a load current ILOAD at the current source 808. The voltage monitor 804 is then configured to measure a response of the cell 802 to the modulated load current ILOAD.

In this example, in contrast to the arrangement shown in FIG. 4, the input signal X comprises a current and the response signal Y represents a voltage across cell 802.

The EIS circuitry 806 operates in a similar manner to the EIS circuitry 406 of FIG. 4, apart from that the signal Y being processed is a voltage (as opposed to a current as is the case in FIG. 4) and in that the stimulus STIM is a current (as opposed to a voltage in the case shown in FIG. 4).

The various circuitry and electrochemical cells described herein may be incorporated into a continuous analyte sensor or a continuous glucose sensor or a continuous glucose monitor. The terms "continuous analyte sensor", "continuous glucose sensor", and "continuous glucose monitor" as used herein, will be well-known to a person of ordinary skill in the art and are not to be limited to a special or customized meaning. These terms refer, without limitation, to a device that continuously measures a concentration of an analyte/glucose and/or calibrates the sensor or an electrochemical cell incorporated therein (e.g., by continuously adjusting or determining the sensor's sensitivity and background).

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an AS IC or FPGA. The code may also comprise code for dynamically configuring re-configurable apparatus such as re-programmable logic gate arrays. Similarly the code may comprise code for a hardware description language such as Verilog™ or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general-purpose processor or the like. A module may itself comprise other modules or functional units. A module may be provided by multiple components or sub-modules which need not be co-located and could be provided on different integrated circuits and/or running on different processors.

Embodiments may be implemented in a host device, especially a portable and/or battery powered host device such as a mobile computing device for example a laptop or tablet computer, a games console, a remote control device, a home automation controller or a domestic appliance including a domestic temperature or lighting control system, a toy, a machine such as a robot, an audio player, a video player, or a mobile telephone for example a smartphone.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry for determining an impedance of an electrochemical cell comprising at least one first electrode and a second electrode, the circuitry comprising:
  drive circuitry configured to apply a stimulus to the electrochemical cell;
  sense circuitry configured to measure a response of the electrochemical cell to the stimulus; and
  processing circuitry configured to:
    determine an estimated transfer function of the electrochemical cell based on the stimulus and the response;
    determine a score for the estimated transfer function; and
    adjust the stimulus or circuitry used to measure the response based on the score.

2. Circuitry of claim 1, wherein adjusting the stimulus comprises:
  adjusting an amplitude of the stimulus or a period of the stimulus.

3. Circuitry of claim 1, wherein the stimulus comprises a step signal or an impulse signal.

4. Circuitry of claim 1, wherein determining the score comprises:
  determining a consistency between the stimulus and the response.

5. Circuitry of claim 1, wherein determining the score comprise:
  determining a coherence between the stimulus and the response;
  determining a consistency between the stimulus and the response; and
  combining the coherence and the consistency to obtain the score.

6. Circuitry of claim 1, wherein determining the score comprises:
  determining one or more quality metrics.

7. Circuitry of claim 1, wherein the stimulus comprises a voltage stimulus and wherein the measured response comprises a response current, wherein the electrochemical cell comprises a potentiostat.

8. Circuitry of claim 1, wherein the stimulus comprises a stimulus current and wherein the measured response comprises a voltage response, wherein the electrochemical cell comprises a potentiometric sensor or a battery.

9. Circuitry of claim 1, wherein the processing circuitry is configured to:
  determine the impedance of the electrochemical cell based on the estimated transfer function.

10. Circuitry of claim 9, wherein the impedance of the electrochemical cell is determined based on the estimated transfer function if the score is above a first confidence threshold.

11. Circuitry of claim 1, wherein the circuitry is configured to:
   apply the adjusted stimulus to the electrochemical cell;
   measure an adjusted response to the electrochemical cell to the stimulus; and
   determine an adjusted estimated transfer function of the electrochemical cell based on the adjusted stimulus and the adjusted response.

12. Circuitry of claim 11, wherein the processing circuitry is configured to:
   determine the impedance of the electrochemical cell based on the adjusted estimated transfer function.

13. Circuitry of claim 11, wherein the processing circuitry is configured to:
   combine the estimated transfer function and the adjusted transfer function to obtain a combined estimated transfer function; and
   determine the impedance of the electrochemical cell based on the combined estimated transfer function.

14. Circuitry of claim 1, wherein the stimulus comprises a pseudorandom sequence.

15. Circuitry of claim 14, wherein the processing circuitry comprises a plurality of linear feedback shift registers (LFSRs) configured to generate the stimulus, wherein adjusting the stimulus comprises:
   switching generation of the stimulus from a first LFSR of the plurality of LFSRs to a second LFSR of the plurality of LFSRs.

16. Circuitry of claim 1, wherein adjusting the sense circuitry used to measure the response comprises:
   adjusting a resistance of the sense circuitry.

17. Circuitry of claim 16, wherein adjusting the resistance of the sense circuitry comprises:
   adjusting a series resistance provided in series with the second electrode of the electrochemical cell.

18. Circuitry of claim 1, wherein adjusting the sense circuitry used to measure the response comprises:
   adjusting a bandwidth of an amplifier of the sense circuitry.

19. Circuitry of claim 18, wherein the bandwidth of the amplifier is adjusted in dependence on the bandwidth of the applied stimulus.

20. Circuitry of claim 1, wherein determining the score comprises:
   determining a coherence between the stimulus and the response.

21. Circuitry of claim 20, wherein the score is generated for each of a plurality of different frequency bands of the response.

22. An electronic device, comprising the circuitry of claim 1.

23. The electronic device of claim 22, wherein the device comprises one of a continuous glucose monitor, a battery, a mobile computing device, a laptop computer, a tablet computer, a games console, a remote control device, a home automation controller or a domestic appliance, a toy, a robot, an audio player, a video player, or a mobile telephone, and a smartphone.

24. A system comprising:
   the electrochemical cell; and
   circuitry for determining an impedance of the electrochemical cell comprising at least one first electrode and a second electrode, the circuitry comprising:
      drive circuitry configured to apply a stimulus to the electrochemical cell;
      sense circuitry configured to measure a response of the electrochemical cell to the stimulus; and
      processing circuitry configured to:
         determine an estimated transfer function of the electrochemical cell based on the stimulus and the response;
         determine a score for the estimated transfer function; and
         adjust the stimulus or circuitry used to measure the response based on the score.

25. A method of determining an impedance of an electrochemical cell comprising at least one first electrode and a second electrode, the method comprising:
   applying a stimulus to the electrochemical cell, the stimulus having a stimulation frequency and a stimulation amplitude;
   measuring a response of the electrochemical cell to the stimulus; and
   determining an estimated transfer function of the electrochemical cell based on the stimulus and the response;
   determining a score for the estimated transfer function; and
   adjusting the stimulus or circuitry used to measure the response based on the score.

* * * * *